US007469462B2

(12) United States Patent
Richardson et al.

(10) Patent No.: US 7,469,462 B2
(45) Date of Patent: Dec. 30, 2008

(54) METHOD OF ASSEMBLING AN ELECTRONIC CONTROL PEDAL ASSEMBLY

(75) Inventors: Theodore Richardson, Gaylord, MI (US); Kirk Nielsen, Jacksonville, FL (US); Richard Boatright, Houghton Lake, MI (US); Jeffrey Gibson, Bellaire, MI (US)

(73) Assignee: Dura Global Technologies, Inc., Rochester Hills, MI (US)

( * ) Notice: Subject to any disclaimer, the term of this patent is extended or adjusted under 35 U.S.C. 154(b) by 844 days.

(21) Appl. No.: 11/063,222

(22) Filed: Feb. 20, 2005

(65) Prior Publication Data

US 2006/0185468 A1 Aug. 24, 2006

(51) Int. Cl.
*G05G 1/30* (2008.04)
*G01R 3/00* (2006.01)

(52) U.S. Cl. .......................... 29/595; 29/593; 29/893.1; 74/512; 74/513; 74/514; 74/560

(58) Field of Classification Search .................. 29/593, 29/595, 893.1, 893.2, 407.05, 407.09, 407.1, 29/434; 74/512, 513, 514, 560; 123/399
See application file for complete search history.

(56) References Cited

U.S. PATENT DOCUMENTS

| | | | | |
|---|---|---|---|---|
| 6,220,222 | B1 * | 4/2001 | Kalsi | 123/399 |
| 6,330,838 | B1 * | 12/2001 | Kalsi | 74/514 |
| 6,360,631 | B1 * | 3/2002 | Wortmann et al. | 74/513 |
| 6,460,429 | B1 * | 10/2002 | Staker | 74/513 |
| 6,802,113 | B2 * | 10/2004 | Staker | 29/595 |
| 6,857,336 | B2 * | 2/2005 | Staker | 74/513 |
| 6,860,170 | B2 * | 3/2005 | DeForest | 74/512 |

* cited by examiner

*Primary Examiner*—Jermie E Cozart
(74) *Attorney, Agent, or Firm*—Richard M. Mescher; Porter, Wright, Morris and Arthur, LLP; Dean B. Watson

(57) ABSTRACT

An electronic control pedal assembly includes a fixed support structure and a pedal arm. The pedal arm has a lower end carrying a pedal and is pivotable relative to the support structure. A potentiometer is at least partly carried by the fixed support and operable to generate an electric control signal that varies in magnitude in proportion to the extent of movement of the pedal arm relative to the fixed support structure. The potentiometer has at least one resistive track trimmed after assembly of the potentiometer to the fixed support so that the potentiometer provides a first fixed electric control signal at a idle position of the pedal arm and the potentiometer has at least one resistive track trimmed after assembly of the potentiometer to the fixed support so that the potentiometer provides a second fixed electric control signal at a full throttle position of the pedal arm.

9 Claims, 3 Drawing Sheets

METHOD OF ASSEMBLING AN ELECTRONIC CONTROL PEDAL ASSEMBLY

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

FIELD OF THE INVENTION

The present invention generally relates to a control pedal assembly for a motor vehicle and, more particularly, to a control pedal assembly having an electronic position sensor for indicating pedal position to an electronic throttle controller.

BACKGROUND OF THE INVENTION

Control pedals are typically provided in a motor vehicle, such as an automobile, which are foot operated by the driver. Separate control pedals are provided for operating brakes and an engine throttle. When the motor vehicle has a manual transmission, a third control pedal is provided for operating a transmission clutch. The control pedals are typically connected to control devices by push-pull cables, rods, or other mechanical transmission devices which convert the limited rotary motion of the pedals into useful mechanical motion at the control devices to control operation of the motor vehicle. The engine throttle is typically connected to an accelerator pedal through a mechanical cable.

There have been many attempts to introduce electrical linkages between the control pedal and the control device. Typically, an electronic position sensor converts a position of the control pedal into an electrical signal which is sent to the control device. This electrical linkage has far fewer routing limitations than the mechanical linkages. One such system is an electronic throttle control (ETC) system having an electronic pedal position sensor and electrical wires extending from the electronic pedal position sensor to a vehicle computer which controls the throttle. The electronic pedal position sensor typically provides an electrical voltage output representative of angular position of the accelerator pedal. The electronic pedal position sensor is typically a resistive potentiometer having two or more restive tracks for redundancy in providing a voltage output signal representing the position of the pedal. See U.S. Pat. No. 6,220,222, the disclosure of which is expressly incorporated herein in its entirety by reference, for an example of such an electronic pedal position sensor.

It is desirable to maintain a close tolerance of an output voltage set point for the pedal position sensor. The output voltage set point is typically at a pedal position corresponding to idle so that the set point controls engine idle speed. However, the buildup of mechanical assembly tolerances within the assembly makes it difficult to maintain the idle output voltage set point with the relatively tight tolerance. To solve this problem, a wiper of the pedal position sensor is adjusted relative to the desired pedal position during installation of the sensor until a desired output voltage is obtained for the desired pedal position. The wiper is then locked into position to maintain the positional relationship between the wiper and the pedal so that a finite output voltage at the desired pedal position (typically idle) is obtained. See U.S. Pat. No. 6,460,429, the disclosure of which is expressly incorporated herein in its entirety by reference, for an example of such an assembly method.

While this assembly method may lessen the difficulty of maintaining the desired outage voltage at the desire set point or pedal position within a close tolerance, this type of adjustment demands a mechanical interface and lock mechanism can be relatively costly to produce and assemble. Additionally, only a single output voltage set point can be set using this assembly method which means that a second important value (typically the wide open throttle position) is left to float based on the fixed relationship to the idle position. Accordingly, there is a need in the art for an improved control pedal assembly having an electronic position sensor indicating pedal position.

SUMMARY OF THE INVENTION

The present invention provides a control pedal assembly which overcomes at least some of the above-noted problems of the related art. According to the present invention, an electronic control pedal assembly comprising, in combination, a fixed support structure and a pedal arm supported for movement relative to said fixed support. The pedal arm has a lower end carrying a pedal and an upper end pivotably supported on a shaft to define a pivot axis. The pedal arm is pivotable relative to the support structure about the pivot axis. A sensor is at least partly carried by the fixed support and operable to generate an electric control signal that varies in magnitude in proportion to the extent of movement of the pedal arm relative to the fixed support structure. The sensor preferably includes a potentiometer which has at least one resistive track trimmed after assembly of the sensor to the fixed support so that the sensor provides a first desired electric control signal at a first position of the pedal arm.

According to another aspect of the present invention, a method of assembling an electronic control pedal assembly comprises, in combination, the steps of providing a fixed support structure, providing a pedal arm supported for movement relative to said fixed support, providing the pedal arm with a lower end carrying a pedal, and pivotably supporting an upper end of the pedal arm on a shaft to define a pivot axis. The pedal arm is pivotable relative to the support structure about the pivot axis. A sensor is provided that is at least partly carried by the fixed support and operable to generate an electric control signal that varies in magnitude in proportion to the extent of movement of the pedal arm relative to the fixed support structure. The sensor is preferably a potentiometer and at least one resistive track of the potentiometer is trimmed after assembly of the sensor to the fixed support so that the sensor provides a first desired electric control signal at a first position of the pedal arm.

According to yet another aspect of the present invention, an electronic control pedal assembly comprises, in combination, a fixed support structure and a pedal arm supported for movement relative to said fixed support. The pedal arm has a lower end carrying a pedal and an upper end pivotably supported on a shaft to define a pivot axis. The pedal arm is pivotable relative to the support structure about the pivot axis A potentiometer is at least partly carried by the fixed support and operable to generate an electric control signal that varies in magnitude in proportion to the extent of movement of the pedal arm relative to the fixed support structure. The potentiometer has at least one resistive track trimmed after assembly of the potentiometer to the fixed support so that the potentiometer provides a first fixed electric control signal at a idle position of the pedal arm and the potentiometer has at least one resistive track trimmed after assembly of the potentiometer to the fixed support so that the potentiometer provides a second fixed electric control signal at a full throttle position of the pedal arm.

From the foregoing disclosure and the following more detailed description of various preferred embodiments it will be apparent to those skilled in the art that the present invention provides a significant advance in the technology and art of electronic control pedal assemblies and methods of assembling the same. Particularly significant in this regard is the potential the invention affords for providing a high quality, reliable, low cost assembly which maintains the output voltage set points within close tolerances. Additional features and advantages of various preferred embodiments will be better understood in view of the detailed description provided below.

BRIEF DESCRIPTION OF THE DRAWINGS

These and further features of the present invention will be apparent with reference to the following description and drawing, wherein.

Figure 1:
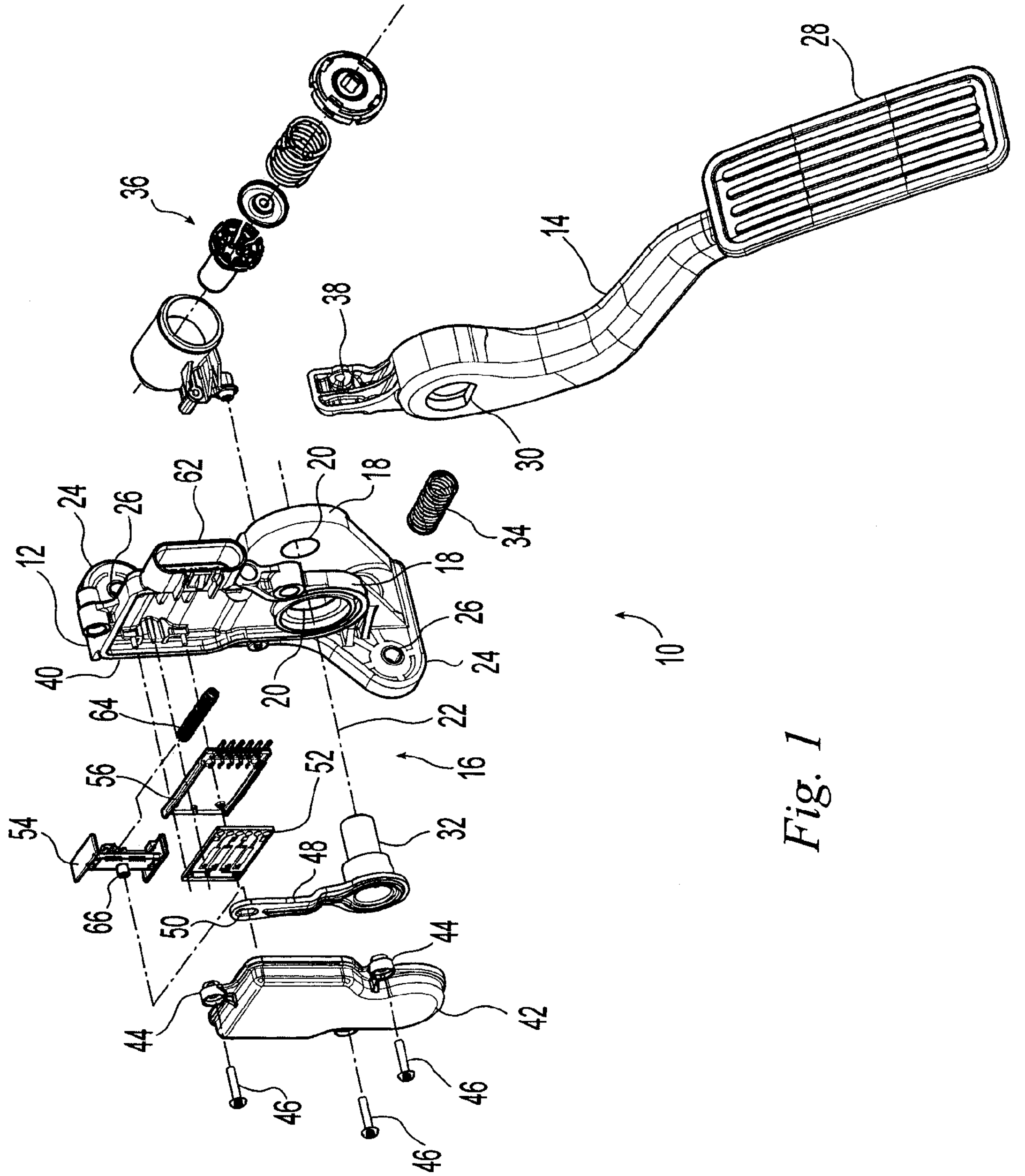
FIG. 1 is an exploded perspective view of a control pedal assembly according to the present invention.

It should be understood that the appended drawings are not necessarily to scale, presenting a somewhat simplified representation of various preferred features illustrative of the basic principles of the invention. The specific design features of a control pedal assembly as disclosed herein, including, for example, specific dimensions will be determined in part by the particular intended application and use environment. Certain features of the illustrated embodiments have been enlarged or distorted relative to others to facilitate visualization and clear understanding. In particular, thin features may be thickened, for example, for clarity or illustration. All references to direction and position, unless otherwise indicated, refer to the orientation of the control pedal assembly illustrated in the drawings. In general, up or upward refers to an upward direction within the plane of the paper in FIG. 2 and down or downward refers to a downward direction within the plane of the paper in FIG. 2. Also in general, fore or forward refers to a direction toward the front of the motor vehicle, that is, a leftward direction within the plane of the paper in FIG. 2 and aft or rearward refers to a direction toward the rear of the motor vehicle, that is, a rightward direction within the plane of the paper in FIG. 2.

DETAILED DESCRIPTION OF CERTAIN PREFERRED EMBODIMENTS

It will be apparent to those skilled in the art, that is, to those who have knowledge or experience in this area of technology, that many uses and design variations are possible for the improved control pedal assemblies disclosed herein. The following detailed discussion of various alternative and preferred embodiments will illustrate the general principles of the invention with reference to an electronic accelerator pedal for use with an automobile. Other embodiments suitable for other applications, such as brake or clutch pedals and/or other types of motor vehicles, will be apparent to those skilled in the art given the benefit of this disclosure. The present invention can be utilized with any motor vehicle having a foot operated control pedal including trucks, buses, vans, recreational vehicles, earth moving equipment and the like, off road vehicles such as dune buggies and the like, air borne vehicles, and water borne vehicles.

Figure 2:
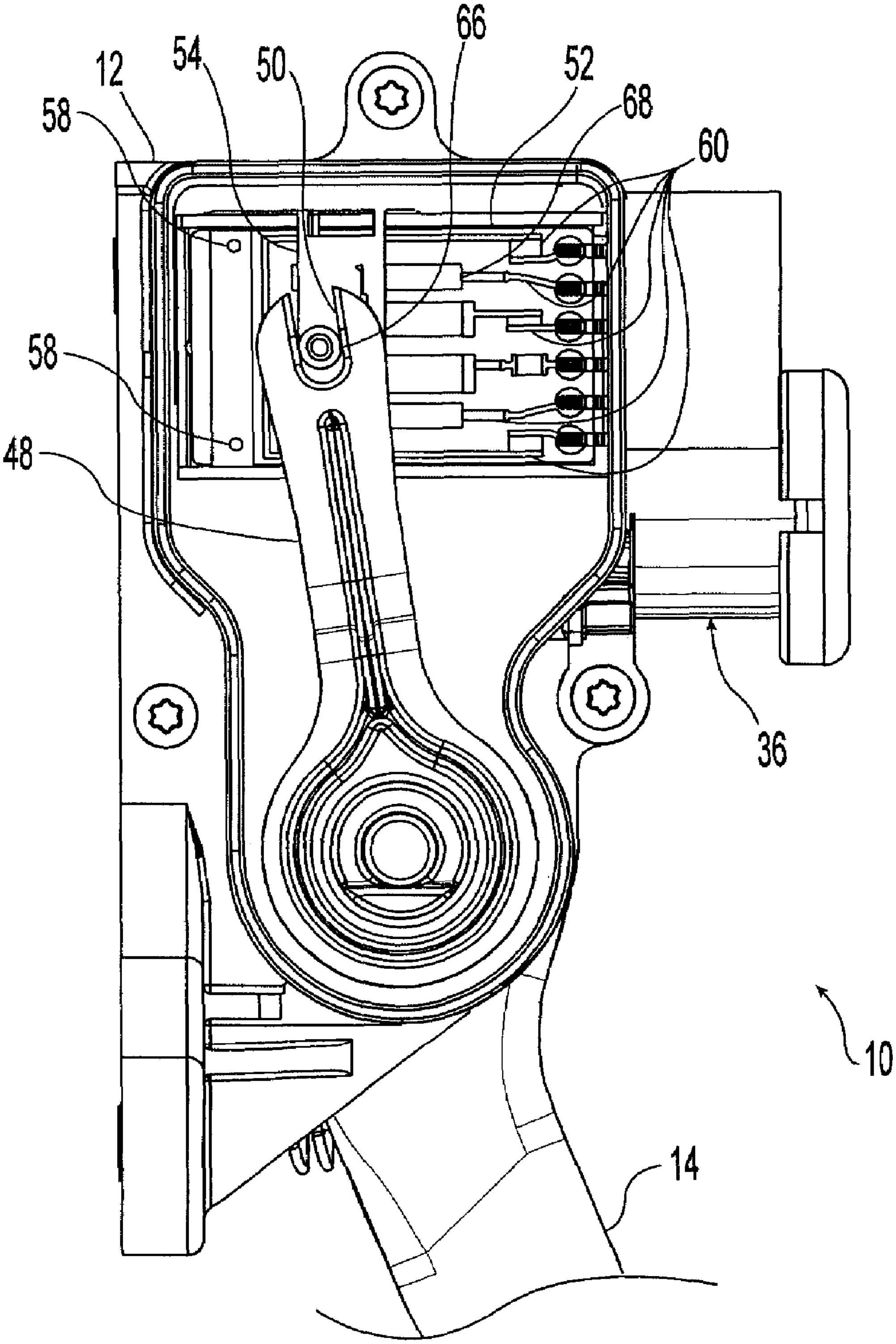
FIG. 2 is an enlarged, fragmented left side elevational view of the control pedal assembly of FIGS. 1 and 2 with a housing cover removed for clarity.

Referring now to the drawings, FIGS. 1 and 2 show an electronic control pedal assembly 10 for a motor vehicle according to the present invention. The control pedal assembly 10 includes a fixed mounting bracket or support structure 12, a pedal arm 14 pivotally connected to the mounting bracket 12, an electronic pedal position sensor 16 operative to provide electrical control signals indicating rotational positions of the pedal arm 14 relative to the mounting bracket 12.

The mounting bracket 12 is sized and shaped for rigid attachment of the adjustable control pedal assembly 10 to a firewall, other wall or suitable support member of the motor vehicle. The mounting bracket 12 may be may be formed of any suitable material such as, for example, a plastic material such as, for example, nylon and may be formed in any suitable manner such as, for example, molding. The illustrated mounting bracket 12 includes a pair of parallel, vertically extending, and laterally spaced-apart walls or ears 18 having coaxial openings 20 therein defining laterally extending, horizontal pivot axis 22 for the pedal arm 14. The illustrated mounting bracket 12 is provided with a plurality of mounting tabs 24 having openings 26 therein for receiving mechanical fasteners to rigidly secure the mounting bracket 12 to the motor vehicle. It is noted that the mounting bracket 12 can alternatively have any other suitable shape and alternatively can be secured to the motor vehicle in any other suitable manner.

The elongate pedal arm 14 extends generally downward from the pivot axis 22. The lower end of the pedal arm 14 carries a pedal 28. The pedal 28 of the illustrated embodiment is formed unitary with the pedal arm 14, that is, molded as a single one-piece component but the pedal 28 can alternatively be partially or fully formed of a separate piece or pieces and attached together. The pedal arm 14 may be may be formed of any suitable material such as, for example, a plastic material like nylon and may be formed in any suitable manner such as, for example, molding.

The pedal arm 14 is sized and shaped for pivotal attachment to the mounting bracket 12. The illustrated pedal arm 14 is generally elongate and has an upper end forming a laterally extending opening 30. The opening 30 is sized and shaped for receiving a pivot pin or shaft 32 laterally extending through the opening 30 and the openings 20 in the ears 18 along the pivot axis 22. The illustrated shaft 32 and opening 30 are provided with cooperating flats so the shaft 32 is rigidly secured to the pedal arm 14 so that the shaft 32 rotates with pedal arm 14. Mounted in this manner, the pedal 28 can be contacted directly by an operator applying a force to the pedal 28 during operation to pivot the pedal arm 14 and the shaft 32 relative to the mounting bracket 12 about the pivot axis 22. Preferably, a resilient return spring 34 such as the illustrated coil spring is provided to bias the pedal arm 14 to a first or idle position (best shown in FIG. 2) so that the pedal arm 14 resiliently returns to the idle position when the operator releases the pedal 28. It is noted that the pedal arm 14 can alternatively be pivotably secured to the support structure 12 and/or biased in any other suitable manner.

The pedal arm 14 is preferably provided with a hysteresis device 36 so that the pedal assembly 10 provides the feel of mechanical throttle cable to the operator. The illustrated hysteresis device 36 is in the form of a spring loaded plunger device. See U.S. Pat. No. 6,360,631 and U.S. patent application Ser. No. 10/041,411, now U.S. Pat. No. 6,758,114 the disclosures of which are expressly incorporated herein in their entireties by reference, for examples of such hysteresis devices. The illustrated pedal arm 14 is provided with an engagement member 38 at its upper end for cooperating with the hysteresis device 36 upon pivoting of the pedal arm 14. It is noted that alternatively any other suitable hysteresis device 36 can be utilized or the hysteresis device 36 can be eliminated.

The pedal arm 14 is operatively connected to the control device such as a throttle via the pedal position sensor 16 so that pivotal movement of the pedal arm 14 about the pivot axis 22 operates the control device in a desired manner. The illustrated pedal position sensor 16 is responsive to movement of the pedal 28 through of the rotation of the pedal arm 14 which results in rotation of the shaft 32 about the pivot axis 22. The illustrated pedal position sensor 16 is a rotational sensor adapted to sense the rotation of the pedal arm 14 and shaft 32.

A housing body 40 is provided having a hollow cavity sized and shaped for containing the pedal position sensor 16 therein. The illustrated housing body 40 is integrally formed with the mounting bracket 12 having a laterally facing open side. The illustrated housing body 40 is provided with a cover 42 to close the open side. The illustrated cover 42 is provided with a plurality of mounting tabs 44 having openings therein for receiving mechanical fasteners 46 to rigidly secure the cover 42 to the housing body 40. Suitable sealing means are preferably provided to seal the cover 42 to the housing body 40 so that the cavity is suitably sealed. It is noted that the housing body 40 and the cover 42 can alternatively have any other suitable shape and alternatively can be secured in any other suitable manner.

One of the illustrated openings 20 opens into the cavity of the housing body 40 and the shaft 32 extends into the cavity. A drive arm 48 extends from the shaft 32 within the cavity perpendicular to the pivot axis 22 so that rotation of the shaft 32 causes the drive arm 48 to rotate. Rotation of the drive arm 48 in turn operates the pedal position sensor 16 for providing an electrical signal indicative of the position of the pedal 28. The drive arm 48 is sized and shaped to cooperate with the pedal position sensor 16 as described in more detail hereinafter. The illustrated drive arm 48 is provided with a radially extending slot 50 at its free end for cooperating with the pedal position sensor 16. The illustrated drive arm 48 is also formed integral with the shaft 32 that is, molded as a single one-piece component. The illustrated shaft 32 is provided with an enlarged diameter portion at the drive arm 48 and within the housing body 40. A hub is provided about the opening 30 which cooperates with the enlarged portion of the shaft 32 within the cavity of the housing body 40. Suitable sealing means are preferably provided at the opening 30 to seal the cavity. It is noted that the drive arm 48 can alternatively have any other suitable shape and alternatively can be secured to shaft 32 in any suitable manner.

The illustrated pedal position sensor 16 is a linear potentiometer for providing a voltage signal indicative of pedal position. It is noted that the pedal position sensor 16 can alternatively be any other suitable type of potentiometer or any other suitable type of position sensor. The illustrated potentiometer 16 includes a substrate 52, a slider member or wiper 54 slidable along the substrate 52, and a connector 56. The illustrated substrate and connector 52, 56 are secured within the housing cavity by a plurality of mechanical fasteners 58. The slider member 54 is constrained in a suitable manner so that it moves only in a straight line along the substrate 52. The slider member 54 can have any suitable type of connection such as, for example a tongue and groove connection. An electrical output signal is produced in the form of a voltage signal responsive to linear displacement of the slider member 54 along the substrate 52 as contacts of the slider member 54 make electrical connection with resistive tracks or pads 60 carried by the substrate 52, as is typical for potentiometers. It is noted that alternatively the tracks 60 can be directly carried by the housing body 40 or any other suitable carrier. The illustrated pedal position sensor 16 is provided with a dual set of three tracks 60 to provide redundancy (total of six tracks 60). It is noted that alternatively any other suitable number of tracks 60 can be utilized. The voltage output signal is provided to the connector 56 which extends through an opening 62 in the housing body 40 where the connector 56 is accessible outside the housing body 40 and is suitably connected to electronic throttle control electronics. The illustrated pedal position sensor 16 is provided with a spring 64 operable between the slider member 54 and the substrate 52 for biasing the slider member 54 to a pre-selected position which is preferably the idle position.

The illustrated slider member 54 is provided with a laterally extending pin or peg 66 which cooperates with the slot 50 of the drive arm 48 to form a pin-slot connection which converts rotation movement of the drive arm 48 in to linear movement of the slider member 54. When the shaft 32 rotates to rotate the drive arm 48, the drive arm 48 linearly moves the slider member 54 along the substrate 52 by engaging the pin 66 as the pin 66 slides along the slot 50.

Figure 3:
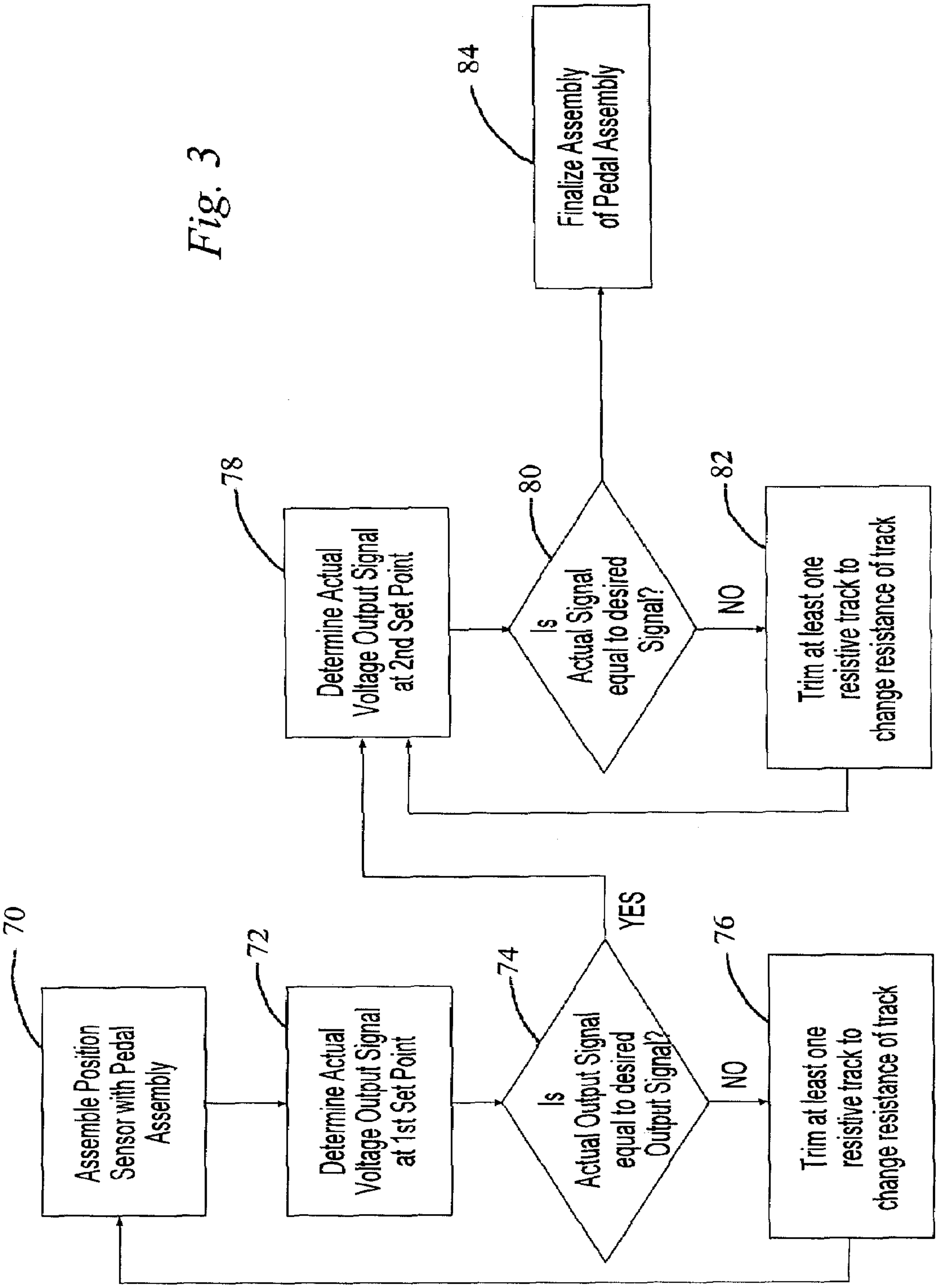
FIG. 3 is a block diagram showing a method of assembling the control pedal assembly of FIGS. 1 and 2 according to the present invention.

As best shown in FIG. 3, the pedal arm 14, the pedal position sensor 16, and the hysteresis device 36 are each assembled to the mounting bracket 12 (indicated at 70). The pedal assembly is then electrically connected to suitable equipment to determine the voltage output signal at a first desired set point of the pedal arm 14 such as, for example, the idle position (indicated at 72). The actual voltage output signal at the first set point is compared to a desired voltage output signal set the first set point (indicated at 74). If the values are not equal with in suitable tolerance limits, at least one of the resistive tracks 60 is trimmed (indicated at 68) to change its length (actual or effective) and therefore the resistance of the track 60 and therefore modify the actual voltage output signal at the first set point to equal the desired voltage output signal at the first set point (indicated at 76). The voltage output signal or the like is preferably monitored while trimming the track 60. The track 60 can be trimmed in any suitable manner such as, for example, by mechanical methods like cutting, slicing or scraping, by laser, or the like. The terms "trim", "trimmed" and the like within the specification and claims means to alter the resistance level of a track 60 by shorting the actual or effective length of the track 60 by any suitable means. For example, if the desired voltage output signal for the sensor 16 at the first set point is 1.0 volts and after assembly the actual voltage output signal at the first set point is 0.9 volts, at least one track 60 is trimmed to reduce its actual length or effective length until the resistance level provides an actual voltage output signal is 1.0 volts for the sensor 16.

Once the tracks 60 are trimmed for the first set point, the pedal 28 is preferably moved to a second set point such as, for example, a full throttle position (indicated at 78). The actual voltage output signal at the second set point is compared to a desired voltage output signal at the second set point (indicated at 80). If the values are not equal within suitable tolerance limits, at least one of the resistive tracks 60 is trimmed to change its length and therefore the resistance level of the track

60 and therefore modify the actual voltage output signal of the sensor 16 at the second set point to equal the desired voltage output signal of the sensor 16 at the second set point (indicated at 82). It is noted that the tracks 60 can be trimmed to set the voltage output signals of the sensor 16 at one, two or more fixed set points as desired. Once the set points are at the fixed desired voltage output signals, the cover 42 can be installed to close the housing body 40 to seal the pedal position sensor 16 therein. Assembly of the pedal assembly 10 is then finalized as needed and the pedal assembly 16 is ready for installation to the motor vehicle (indicated at 84).

During operation, the return spring 34 engages the forward side of the pedal arm 14 near the pivot axis 22 to bias the pedal arm 14 to the idle position when no pressure is applied to the pedal 28. At the idle position, the pedal position sensor 16 sends the desired voltage output signal which was set for the idle position by trimming the tracks 60. During operation of the motor vehicle, the operator depresses the pedal 28 using a foot to control the motor vehicle. The pressure on the pedal 28 pivots the pedal arm 14 about the pivot axis 22 against the bias of the return spring 34. As the pedal arm 14 rotates, the shaft 32 rotates, the drive arm 48 rotates, and the slider member 54 linearly moves along the tracks 60 so that the pedal position sensor 16 sends electrical voltage output signals indicating the magnitude of movement of the pedal 28 to the control the throttle of the motor vehicle. If the operator depresses the pedal 28 to the full throttle position, the pedal position sensor 16 sends the desired voltage output signal for the full throttle position which was set by trimming the tracks 60. When the operator releases the pedal 28, the return spring 34 resiliently returns the pedal arm 14 to the idle position and the pedal position sensor 16 sends the desired voltage output signal for the idle position which was set by trimming the tracks 60

From the above description, it should be appreciated that the present invention provides a control pedal assembly and method which is relatively simple and inexpensive to produce and is well suited to automated assembly. It should also be appreciated that a desired output voltage can be set for more than one set point.

From the foregoing disclosure and detailed description of certain preferred embodiments, it will be apparent that various modifications, additions and other alternative embodiments are possible without departing from the true scope and spirit of the present invention. For example, it will be apparent to those skilled in the art, given the benefit of the present disclosure, that the control pedal assembly be an adjustable pedal assembly wherein a drive assembly selectively adjusts the disclosed control pedal assembly in a forward/rearward direction relative to the steering wheel/seat of the motor vehicle. The embodiments discussed were chosen and described to provide the best illustration of the principles of the present invention and its practical application to thereby enable one of ordinary skill in the art to utilize the invention in various embodiments and with various modifications as are suited to the particular use contemplated. All such modifications and variations are within the scope of the present invention as determined by the appended claims when interpreted in accordance with the benefit to which they are fairly, legally, and equitably entitled.

What is claimed is:

1. A method of assembling an electronic control pedal assembly comprising, in combination, the steps of:

providing a fixed support structure;

providing a pedal arm supported for movement relative to said fixed support;

providing the pedal arm with a lower end carrying a pedal;

pivotably supporting an upper end of the pedal arm on a shaft to define a pivot axis;

wherein the pedal arm is pivotable relative to the support structure about the pivot axis;

providing a sensor at least partly carried by the fixed support and operable to generate an electric control signal that varies in magnitude in proportion to the extent of movement of the pedal arm relative to the fixed support structure;

wherein the sensor is a potentiometer; and trimming at least one resistive track of the potentiometer after assembly of the sensor to the fixed support so that the sensor provides a first desired electric control signal at a first position of the pedal arm.

2. The method according to claim 1, wherein the first position of the pedal arm is an idle position.

3. The method according to claim 1, further comprising the step of trimming at least one resistive track of the potentiometer after assembly of the sensor to the fixed support so that the sensor provides a second desired electric control signal at a second position of the pedal arm.

4. The method according to claim 3, wherein the first position of the pedal arm is an idle position and the second position of the pedal arm is a full throttle position.

5. The method according to claim 1, wherein the potentiometer is a linear potentiometer.

6. The method according to claim 1, wherein the potentiometer has at least two resistive tracks for redundancy.

7. The method according to claim 1, wherein the potentiometer has a plurality of the resistive tracks.

8. The method according to claim 1, wherein resistive track is trimmed by a laser.

9. The method according to claim 1, wherein the resistive track is trimmed by mechanical means.

* * * * *